(12) United States Patent
Hierlemann et al.

(10) Patent No.: US 7,250,650 B2
(45) Date of Patent: Jul. 31, 2007

(54) FIELD-EFFECT TRANSISTOR STRUCTURE AND ASSOCIATED SEMICONDUCTOR MEMORY CELL

(75) Inventors: Matthias Hierlemann, Fishkill, NY (US); Rudolf Strasser, HsinChu (TW)

(73) Assignee: Infineon Technologies AG, Munich (DE)

( * ) Notice: Subject to any disclaimer, the term of this patent is extended or adjusted under 35 U.S.C. 154(b) by 49 days.

(21) Appl. No.: 11/133,086

(22) Filed: May 19, 2005

(65) Prior Publication Data
US 2005/0218446 A1  Oct. 6, 2005

Related U.S. Application Data

(63) Continuation of application No. PCT/DE03/003748, filed on Nov. 12, 2003.

(30) Foreign Application Priority Data
Nov. 21, 2002  (DE) .................................. 10254415

(51) Int. Cl.
| H01L 27/108 | (2006.01) |
| H01L 29/76 | (2006.01) |
| H01L 29/94 | (2006.01) |
| H01L 31/119 | (2006.01) |

(52) U.S. Cl. ...................... 257/301; 257/304; 257/305; 257/311

(58) Field of Classification Search ........ 257/301–305, 257/355–363, 296, 311
See application file for complete search history.

(56) References Cited

U.S. PATENT DOCUMENTS

| 5,366,908 A | 11/1994 | Pelella |
| 6,046,480 A | 4/2000 | Matsumoto et al. |
| 6,191,455 B1 | 2/2001 | Shida |
| 2001/0003369 A1 | 6/2001 | Roche |

OTHER PUBLICATIONS

International Search Report from corresponding PCT application No. PCT/DE2003/03748, no date.
International Examination Report from corresponding PCT application No. PCT/DE2003/03748, no date.

*Primary Examiner*—Thien F Tran
(74) *Attorney, Agent, or Firm*—Brinks Hofer Gilson & Lione

(57) ABSTRACT

A field-effect transistor (FET) structure and method of formation thereof is presented. The FET structure includes first and second source/drain regions formed in a semiconductor substrate to define a channel region. A gate insulation layer is formed at a surface of the channel region. A control layer is formed at a surface of the gate insulation layer. A diode doping region is formed to realize a diode in the semiconductor substrate. An electrically conductive diode connection layer connects the diode doping region to the control layer. A depression is formed in the semiconductor substrate. The diode doping region is formed at a bottom of the depression and the diode connection layer is formed in the depression to dissipate excess charge carriers in the semiconductor substrate.

14 Claims, 7 Drawing Sheets

FIELD-EFFECT TRANSISTOR STRUCTURE AND ASSOCIATED SEMICONDUCTOR MEMORY CELL

PRIORITY

This application is a continuation of International Application PCT/DE03/003748, filed on Nov. 12, 2003, which claims the benefit of priority to German Patent Application 102 54 415.8, filed on Nov. 21, 2002, incorporated herein by reference

TECHNICAL FIELD

The present invention relates to a field-effect transistor structure, an associated semiconductor memory cell and an associated fabrication method, and in particular to a field-effect transistor structure as can be used in DRAM memories.

BACKGROUND

In semiconductor technology, the most advanced technologies with the highest integration densities are used in particular for fabricating so-called DRAM memories (dynamic random access memory). With an increasing packing density or integration density, however, the following difficulties result for example in DRAM semiconductor memories:

In order to control a short-channel behavior (roll-off) of a selection transistor in a DRAM semiconductor memory cell, from technology generation to technology generation an associated well doping or a channel implant is increased. However, this results in a greater body effect, which in turn impairs writing behavior. The body effect is manifested in an increase in the threshold voltage of the field-effect transistor as source-body voltage increases. The term "body" hereinafter denotes in particular the semiconductor substrate situated directly in the vicinity of the transistor or of the source/drain regions and of the channel region.

During a writing operation in a DRAM memory cell with a trench capacitor (for example writing a logic "1"), the potential of a source/drain region which is connected to the trench capacitor, for example, increases with increasing charging of the corresponding trench capacitor capacitance. Given a fixed body potential, this means an increase in the voltage between the source/drain region and the body, as a result of which the transistor, depending on a charging state of the trench capacitor, increases its threshold voltage on account of the body effect. This phenomenon is generally referred to as "source follower mode".

As a direct consequence of the increased threshold voltage, the field-effect transistor then also supplies a lower current given an otherwise identical voltage difference between a further source/drain region or a bit line and the capacitance of the trench capacitor. Consequently, the complete charging of the trench capacitor takes correspondingly longer, for which reason this body effect correspondingly limits the writing performance for example in a DRAM memory cell.

Furthermore, as the integration density increases, it becomes more and more difficult to ensure a contact connection of the local well regions, i.e. well regions relative to the selection transistor. In particular on account of depletion around the trench capacitor regions, it is difficult, in particular in the case of a high packing density, to ensure a low-impedance or highly conductive current path from the well contacts to the selection transistors without potential barriers. This is true particularly since as the well doping increases, the associated field strengths at connection regions with respect to the trench capacitor increase correspondingly.

FIG. 1 shows a simplified plan view of a conventional DRAM memory cell arrangement, where STI designates shallow trench isolations which are formed in strip-type fashion and form a multiplicity of strip-type active regions AA in a semiconductor substrate. In the active regions AA, respective first and second source/drain regions S/D with a channel region lying in between are formed to produce a field-effect transistor structure. To realize a control layer CG above the channel region, strip-type word lines WL are formed essentially perpendicular to the strip-type active regions AA, the word lines enabling the field-effect transistor structure to be driven. DTC denotes a trench capacitor (Deep Trench Capacitor) which is conductively connected to one of the source/drain regions, the further source/drain region S/D being connected to a bit line (not illustrated). Furthermore, a minimum feature size that can be fabricated lithographically is represented by F in FIG. 1.

FIG. 3 shows a simplified perspective view of the memory cell arrangement in accordance with FIG. 1 along a section I-I, identical reference symbols designating identical or corresponding elements and layers and a repeated description being dispensed with below.

In accordance with FIG. 3, a semiconductor memory cell accordingly comprises a trench capacitor DTC (deep trench capacitor) which is connected via an electrically conductive buried connection plate BP (buried plate) to further trench capacitors or the external electrodes thereof (not illustrated) in the memory array. The lower part of the trench capacitor DTC with its internal and external electrodes is not illustrated in FIG. 3.

The upper region of the trench capacitor DTC as illustrated in FIG. 3 has a trench capacitor connection layer 8 comprising, for example, polycrystalline, highly-doped semiconductor material and in particular polysilicon. For the insulation of the trench capacitor connection layer 8, the upper part of the trench capacitor DTC has a collar insulation layer 7 comprising silicon dioxide, for example. In order to connect the trench capacitor connection layer 8 to a first source/drain region S/D, by way of example, a buried layer BS (buried strap) is formed below the first source/drain region S/D. Like the first source/drain region S/D, the buried layer BS preferably constitutes a highly-doped semiconductor region of a first conduction type n, which is formed in the semi-conductor substrate of the second conduction type p, opposite to the first conduction type n. A top insulating layer 9, preferably comprising silicon dioxide, is formed in order to insulate the trench capacitor connection layer 8 from a word line WL formed at the substrate surface or the passive control layer region PCG (passive control gate) of the word line.

Furthermore, at the surface of the semiconductor substrate, a second source/drain region once again of the first conduction type n is formed in the semiconductor substrate 1, thereby defining a channel region of the field-effect transistor structure. At the surface of the channel region or of the semiconductor substrate 1, a gate insulation layer 2 is formed at least between these first and second source/drain regions S/D, at the surface of which gate insulation layer a control layer 3 (CG, control gate) as part of the word line WL formed in strip-type fashion undertakes the driving of the field-effect transistor structure. Via a bit line contact BLK, which makes contact with the second source/drain region S/D of the field-effect transistor structure, the region is connected to a bit line BL lying essentially above the word lines WL and parallel to the active regions AA formed in strip-type fashion.

For the connection of a well region (not explicitly illustrated) in the semiconductor substrate 1, a well connection doping region WA is usually provided at some distance from the field-effect transistor structure. In accordance with FIG. 3, the well connection doping region WA has a second conduction type p opposite to the first conduction type n, and usually serves for dissipating or depleting the charge carriers L that occur in the body or semiconductor substrate 1 present directly at the field-effect transistor structure.

FIG. 4 shows a simplified equivalent circuit diagram of the semiconductor memory cell in accordance with FIG. 3, identical reference symbols designating identical or corresponding elements and regions and a repeated description being dispensed with below.

In particular, the resistor R, which essentially results from an electrical conductivity of the well region or of the semiconductor substrate 1 with respect to the well connection doping region WA, increases as the integration density increases, which leads to an impairment of the function on account of the body effect described above.

In particular in DRAM semiconductor memory cells with associated trench capacitors, this problem is intensified by the fact that the trench capacitors DTC arranged in an array in accordance with FIG. 1 move ever closer together and, consequently, the clearance between the trench capacitors for dissipating the charge carriers L becomes more and more constricted. Moreover, DRAM semiconductor memory cells also do not afford the possibility of dissipating the charge carriers L via the deeper regions of the semiconductor substrate 1, since, by virtue of the buried connection plate BP for connecting the counterelectrodes of the trench capacitors DTC, an insulating layer is built up in this region.

However, an insufficient or high-impedance well connection of the body or of the semiconductor substrate in direct proximity to the field-effect transistor structure leads sooner or later to its charging and consequently, on account of the body effect, to a reduction of the effective threshold voltage and thus to increased leakage currents. In particular in the case of the DRAM semiconductor memory cell illustrated in FIG. 3, the retention time is thus impaired.

BRIEF SUMMARY

In particular, a diode doping region permits realization of a diode in the semiconductor substrate and a diode connection layer which is electrically conductively connected to a control layer of the field-effect transistor structure permits dissipation of excess charge carriers in the semiconductor substrate. This prevent body effects since the body potential is upwardly limited by the diode voltage.

A depression is formed in the semiconductor substrate, the diode doping region being formed in the bottom region of the depression and the diode connection layer being formed at least in partial regions of the depression. In this way, it is possible to arrange the diode for dissipating excess charge carriers in an optimum depth of the semiconductor substrate, as a result of which the electrical properties of the field-effect transistor structure remain uninfluenced to a particular degree. The depression is formed, for example, directly beside a channel region in a shallow trench isolation that defines a channel width of the channel region, thus resulting in a space-optimized realization which is suitable for high integration densities.

A dielectric layer is formed at the walls of the depression between the diode connection layer and the semiconductor substrate for the purpose of realizing a capacitor connected to the control layer, thereby enabling not only the limitation of the body potential by the diode but also an intensified dynamic coupling of the control layer to the body or the semiconductor substrate. In particular in the case of frequently changing signals at the control layer, this results in rapid and effective dissipation of charge carriers, as a result of which the electrical properties remain uninfluenced to a particular degree.

When using a highly doped semiconductor material as a diode connection layer, it is possible, on account of outdiffusion during later thermal process steps, to form the diode doping region without an additional process step and in a self-aligning manner in the semiconductor substrate, thereby significantly simplifying the requirements made of an alignment accuracy.

A semiconductor memory cell having a selection transistor of the type described above is connected to a trench capacitor by its first source/drain region and to a bit line by its second source/drain region, the control layer constituting a part of a word line running essentially perpendicular to the bit line, and the diode doping region being formed below the word line in the semiconductor substrate. In the case of an arrangement of this type, a self-aligning contact connection between the control layer and the diode doping region is obtained in a particularly simple manner.

Furthermore, a trench isolation may be formed in strip-type fashion in the semiconductor substrate to form strip-type active regions, the trench capacitor substantially lying in the active region. In this way, the trench isolation may also be used as an insulating dielectric layer for the diode connection layer, thus resulting in an area-optimized realization of a semiconductor memory cell arrangement.

For trench capacitors having at the surface a width which is greater than a width of the active region, it is possible to uncover a trench isolation adjoining the active region for the trench capacitor to be displaced into a further adjoining trench isolation, as a result of which the depression may in turn be fitted optimally into the trench isolation and an optimum layout realization also results for these trench capacitor types.

A surface cross section of the trench capacitor may have an oval form and a displacement of at most 0.5 F, where F represents a minimum feature size that can be fabricated lithographically, as a result of which a self-aligning possibility for connecting the field-effect transistor structure to the trench capacitor is produced with curvature-dependent material properties being utilized.

With regard to the method for fabricating a semiconductor structure, a semiconductor substrate is prepared in a suitable manner, a depression is formed in a trench isolation, a diode doping region is formed at the bottom of the depression and an electrically conductive diode connection layer is filled in the depression, a mask layer is removed, a gate insulation layer is formed, a control layer is formed at the surface of the gate insulation layer, the surface thus fabricated is planarized at least as far as the trench isolation and an electrically conductive connecting layer is subsequently formed for the purpose of connecting the control layer to the diode connection layer. In this way, it is possible to adapt standard processes with minimal changes or insertions of additional process steps for the realization of the above-described diode doping regions and diode connection layers. This results in a particularly simple and cost-effective realization.

The foregoing summary has been provided only by way of introduction. Nothing in this section should be taken as a limitation on the following claims, which define the scope of the invention.

BRIEF DESCRIPTION OF THE DRAWINGS

The invention will be explained in more detail in the following text using a number of exemplary embodiments and with reference to the drawings, in which.

In the figures, identical or functionally identical elements are provided with the same reference symbols.

DETAILED DESCRIPTION OF THE PREFERRED EMBODIMENTS

Figure 1:
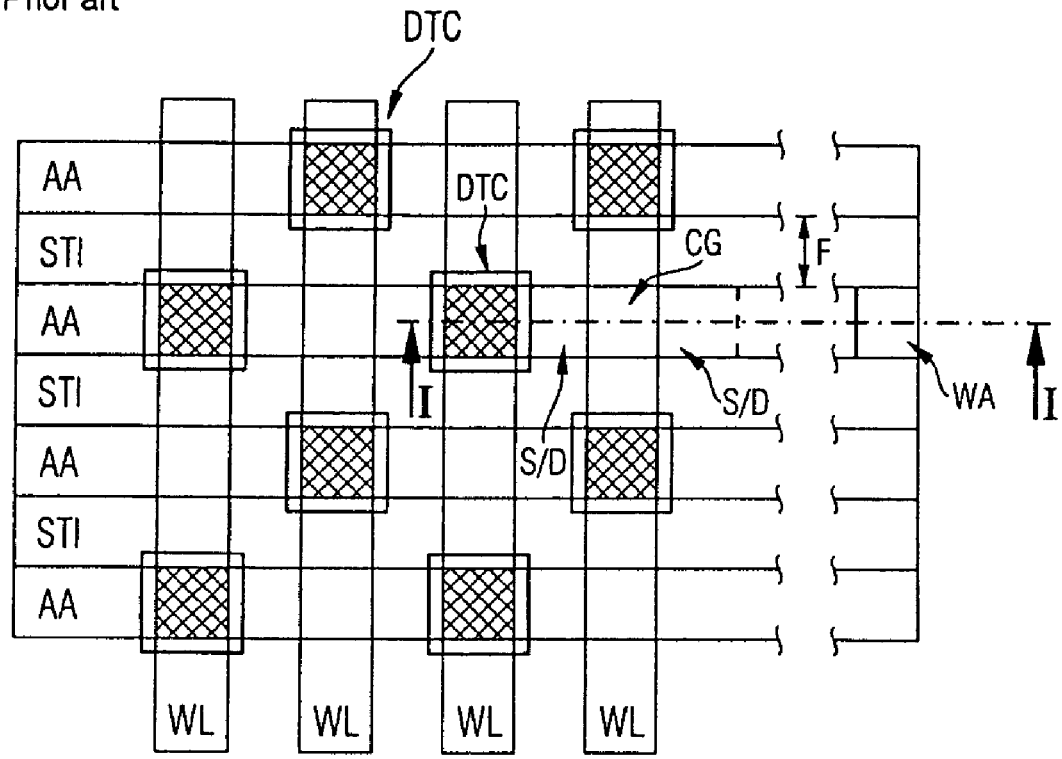
FIG. 1 shows a simplified plan view of a conventional semiconductor memory cell arrangement.
Figure 2:
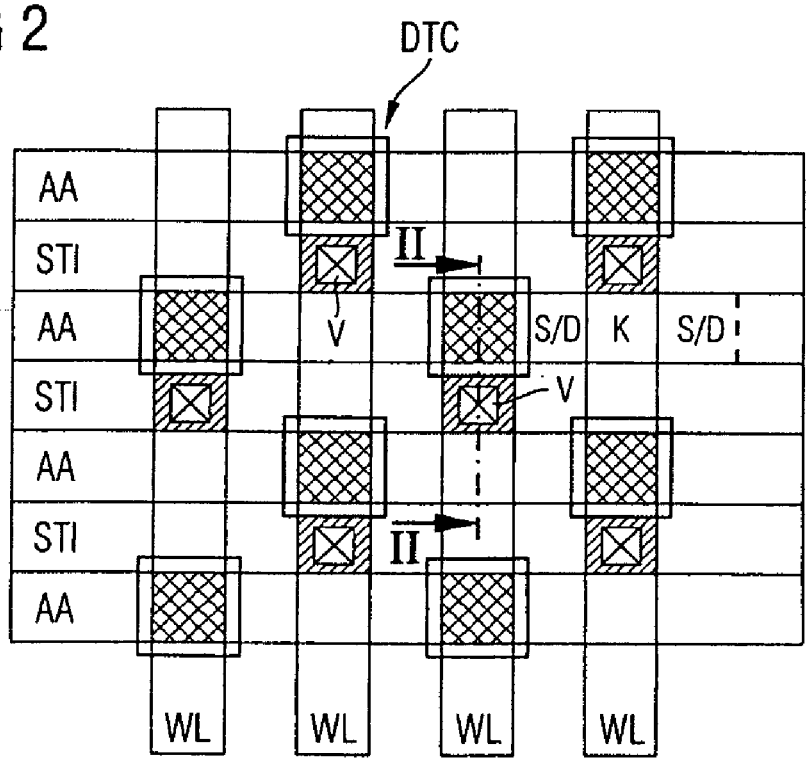
FIG. 2 shows a simplified plan view of a semiconductor memory cell arrangement in accordance with a first exemplary embodiment of the present invention.

FIG. 2 shows a simplified plan view of a semiconductor memory cell arrangement in accordance with a first exemplary embodiment, identical reference symbols representing elements and layers identical or corresponding to those in FIG. 1 and a repeated description being dispensed with below.

Figure 3:
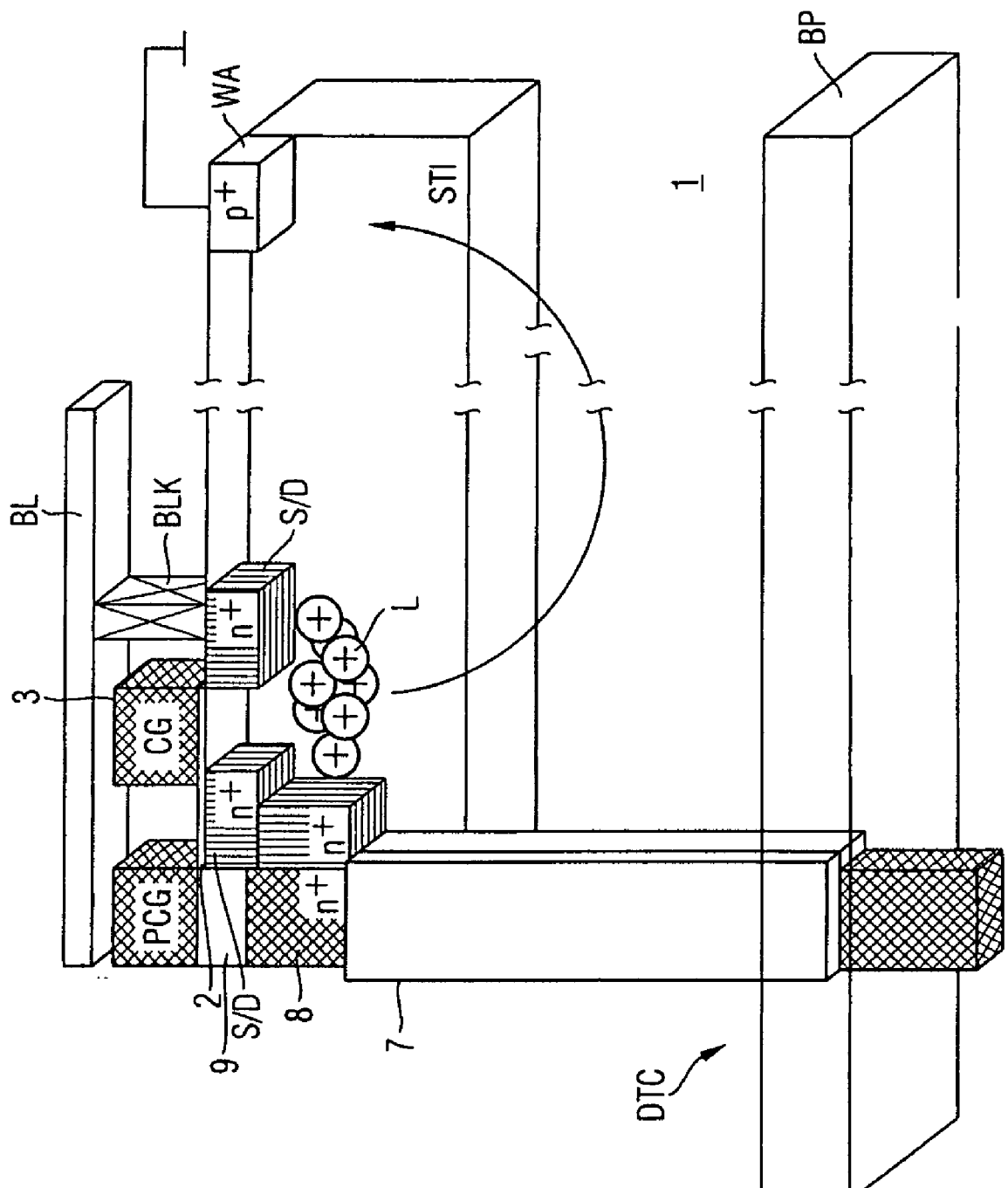
FIG. 3 shows a simplified perspective view of a conventional semiconductor memory cell in accordance with FIG. 1 along a section I-I.
Figure 4:
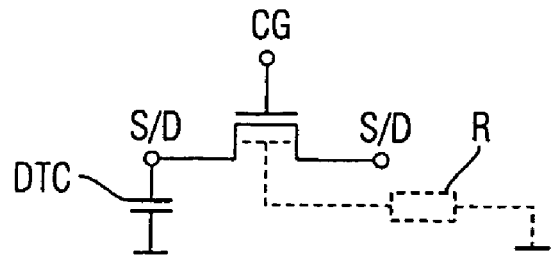
FIG. 4 shows a simplified equivalent circuit diagram of the conventional semiconductor memory cell in accordance with FIG. 3.

The perspective view along a section I-I in FIG. 1 which is illustrated in FIG. 3 in this case also essentially corresponds to a corresponding section (not illustrated) in FIG. 2, but the well connection doping region WA may not be present in the exemplary embodiment according to the invention. In accordance with FIG. 2, the well connection doping region, which is no longer effective on account of increased packing densities, is replaced by a depression V, which is formed in a shallow trench isolation STI and at the bottom region of which a diode doping region is formed in the semiconductor substrate.

Figure 5:
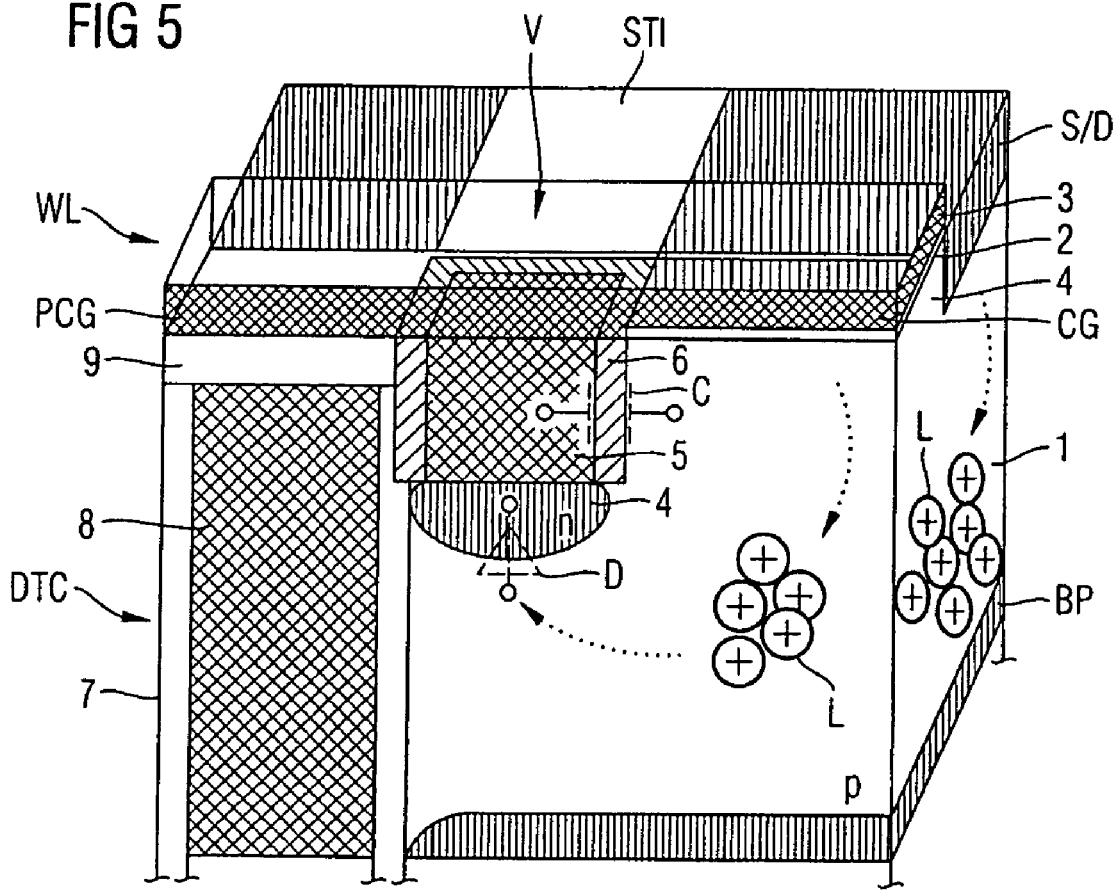
FIG. 5 shows a simplified perspective view of a semiconductor memory cell in accordance with FIG. 2 along a section II-II.

FIG. 5 shows a simplified perspective view of the semiconductor memory cell according to the invention as shown in FIG. 2 along a section II-II, once again identical reference symbols designating identical or corresponding elements and layers and a repeated description being dispensed with below.

In accordance with FIGS. 2 and 5, the field-effect transistor structure has a first and second source/drain region S/D of a first conduction type n, which are formed in a semiconductor substrate 1 of a second conduction type p, opposite to the first conduction type n, to define a channel region K. Crystalline silicon is preferably used as semiconductor material 1, it also being possible to use alternative semiconductor materials such as germanium, III-V semiconductor materials and the like.

A gate insulation layer 2 is formed at the surface of the channel region K. The gate insulation layer preferably comprises thermally formed silicon dioxide but may also comprise a different electrically insulating material. In particular, it is also possible in this case to use tunnel oxides or other gate dielectrics.

Furthermore, a control layer 3 is formed at the surface of the gate insulation layer 2, the control layer constituting a control layer region CG (control gate) of an associated word line WL.

In order to realize a diode D, according to the invention, a diode doping region 4 is formed in the semiconductor substrate 1 or in the body of the field-effect transistor structure. A diode connection layer 5 or a corresponding partial region of the word line WL electrically conductively connects the control layer 3 to the diode doping region 4 to permit dissipation of excess charge carriers L (e.g. holes).

In this way, it is possible to equalize the excess charge L in the semiconductor substrate 1 or in the body of the field-effect transistor structure with the potential of the control layer 3 (pn junction, pn capacitance).

Preferably, the diode doping region 4 is formed in a bottom region of a depression V in the semiconductor substrate 1, as a result of which the diode D can be positioned in a suitable depth within the semiconductor substrate 1.

In accordance with FIG. 5, the depression V is formed within the trench isolation STI—formed as shallow trench isolation—directly below the word line WL as follows. The semiconductor substrate 1, as a result of which the diode doping region 4 is formed in an optimum depth, namely the depth of the trench isolation STI within the semiconductor substrate. Furthermore, a part of the trench isolation STI may remain at the walls of the depression V, as a result of which a dielectric layer 6 is formed between the diode connection layer 5 and the semiconductor substrate 1 to realize an additional capacitor C connected to the control layer 3. This additional capacitor C results in strong dynamic coupling of the word line or the control layer 3 to the body or the semiconductor substrate 1, as a result of which the conventional fixing of the potential by the well connection doping region or well contact WA usually present no longer exists. In particular during a writing operation, the potential of the body accordingly follows the potential of the word line WL, thereby reducing a potential difference between the word line WL and the body and resulting in shortened writing times (comparable with dynamic VT concepts in logic technologies).

On the other hand, the diode contact or pn junction between the word line WL and the semiconductor substrate 1 results in upward limitation of the body potential. More precisely, at the instant at which the body potential would exceed a "LOW" potential of the word line WL by approximately 0.5 V, electrons are injected into the body and ultimately eliminate the charge carrier or hole excess L—illustrated in FIG. 5—in the body through recombination. An equilibrium can thus be established, no equalization process of this type taking place if the semiconductor memory cell is not selected. In other words, for negative word line potentials of −0.5 V, for example, a body potential of approximately 0 V results outside the writing operation.

In this way it is possible to prevent a so-called source follower effect, thereby improving a writing performance, for example. Furthermore, a so-called "gate overdrive", is reduced in particular by the additional capacitor C, thus resulting in an additional flexibility in the circuit development. The requirements with regard to the control layer potentials or potentials on the word line, a reliability of the gate insulation layer with respect to GIDL phenomena (gate induced drain leakage), etc. can thereby be made less stringent. In particular, however, this results in a further improved integration density on account of the integrated body contact connection, since the space-intensive conventional well contacts can now be obviated.

Accordingly, overall the electrical properties of the field-effect transistor structure are significantly improved or the electrical properties can also be retained for future integration densities.

In accordance with FIG. 5, in order to realize a DRAM semiconductor memory cell, the illustration furthermore shows an upper region of a trench capacitor DTC with its trench capacitor connection layer 8 and its isolation trench layer 7, which are essentially formed in accordance with the prior art according to FIG. 3. Accordingly, a top insulating layer 9 is formed at the surface of the trench capacitor DTC, as a result of which the overlying region of the word line WL acts as passive control layer PCG (passive control gate).

For the connection of an external electrode or counterelectrode (not illustrated) of the trench capacitors DTC, a buried connection plate BP (buried plate) is in turn provided in a deeper region of the semiconductor substrate 1, the buried connection plate usually comprising a semiconductor material of the first conduction type n and thus constituting an insulating space charge zone with respect to the overlying semiconductor substrate 1 or the overlying well of the second conduction type p.

Although, in accordance with FIG. 5, the depression V is formed directly below the word line WL and a self-aligning contact connection is thereby obtained between the control layer 3 and the diode doping region 4, this depression may also be realized at a different location and, in particular, also be arranged in the active region AA. In particular when the depression V is arranged in the active region AA care must be taken to ensure that, for the realization of the capacitor C, a dielectric layer 6 is additionally formed at the sidewalls but not in the bottom region of the depression V, in order to prevent an electrical contact connection with respect to the semiconductor substrate 1.

Preferably, the diode connection layer 5 comprises highly doped semiconductor material (e.g. polysilicon) of the first conduction type n, as a result of which the diode doping region 4 can form in a self-aligning manner in the bottom region of the depression V in subsequent thermal process steps. In the same way, however, after the formation of the depression V, it is also possible to carry out some other doping for example from the gas phase or by means of ion implantation and subsequently to fill an electrically conductive material into the depression V as diode connection layer 5.

Figure 6:
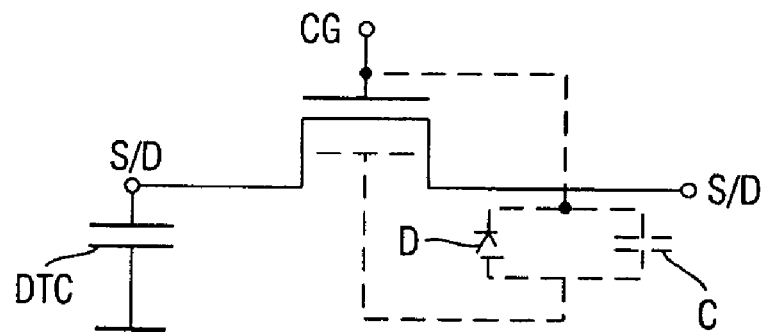
FIG. 6 shows a simplified equivalent circuit diagram of the semiconductor memory cell according to the invention as shown in FIG. 5.

FIG. 6 shows a simplified equivalent circuit diagram of the semiconductor memory cell in accordance with FIG. 5, identical reference symbols representing identical or corresponding elements and a repeated description being dispensed with below.

This equivalent circuit diagram reveals the static (pn junction) and dynamic (capacitance) properties of the diode doping region 4 and of the associated diode connection layer 5, for which reason the diode D and the capacitance C can be adapted to respective circuit conditions.

Figure 7:
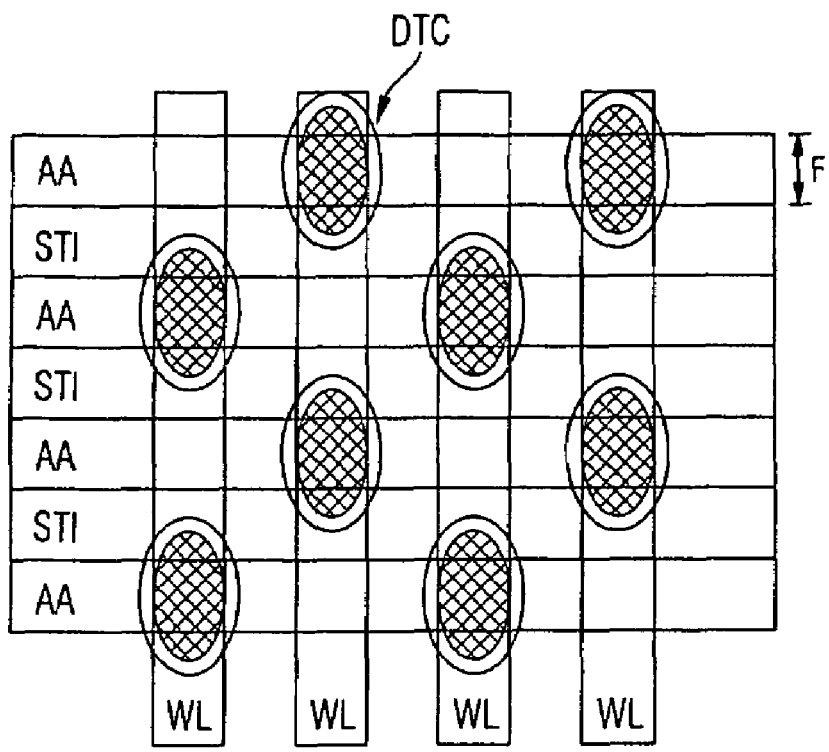
FIG. 7 shows a simplified plan view of a conventional semiconductor memory cell arrangement.
Figure 8:
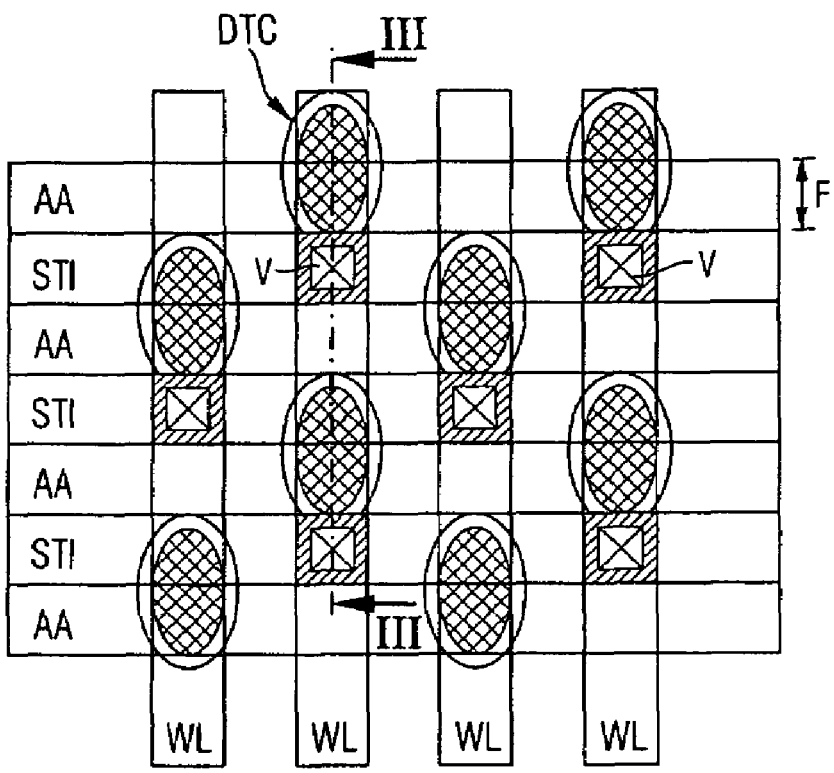
FIG. 8 shows a simplified plan view of a semiconductor memory cell arrangement in accordance with a second exemplary embodiment.

FIG. 7 shows a simplified plan view of a semiconductor memory cell arrangement in accordance with the prior art and FIG. 8 shows an associated plan view of a semiconductor memory cell arrangement in accordance with a second exemplary embodiment, once again identical reference symbols representing layers and elements identical or corresponding to those in FIGS. 1 and 2, for which reason a repeated description is dispensed with below.

In accordance with FIG. 7, conventional semiconductor memory cells and in particular associated trench capacitors may have at a surface a greater width than a width of an active region AA, for which reason the positioning of the depressions V as illustrated in FIG. 2 would lead to a short circuit with the trench capacitor DTC.

In accordance with FIG. 8, the trench capacitors DTC are accordingly displaced by at most 0.5 F in the direction of an adjoining trench isolation STI, where F represents a minimum feature size that can be fabricated lithographically. In this way, the trench isolation, in its surface region, is completely freed of the trench capacitor or the upper region thereof to an extent such that the depression V can once again be formed within the trench isolation STI, as is illustrated in FIG. 8. This displacement is preferably carried out in a range of 0.25 to 0.5 F, thus resulting in a sufficient insulation of the depression V with respect to the trench capacitor DTC in conjunction with optimum area utilization. In order to ensure a sufficient insulation with respect to the trench capacitor, insulating spacer structures in the form of the dielectric layer 6 may be formed in this case in addition to the remaining STI oxide.

The oval forms for a surface cross section of the trench capacitor DTC which are illustrated in FIGS. 7 and 8 afford a further advantage to the effect that, on account of the different radii of curvature and different material properties (stresses) brought about thereby in the insulation layers and in particular in the trench insulation layer 7, it is possible to realize a self-aligning contact connection for the trench capacitor DTC.

As in the case of the first exemplary embodiment, the diode formed below the depression V once again enables a DC coupling in the case of the negative word line/body voltages, while the capacitor formed by the space charge zone of the pn junction and/or the diode connection layer and also the semiconductor substrate enables a capacitive coupling between body and word line for positive word line/body voltages.

Accordingly, a significant performance improvement is once again achieved when writing to the semiconductor memory cell since an effect similar to that in the case of a so-called "active well technique" is achieved in particular through the capacitive coupling of the body to the word line. More precisely, an increase in the body potential takes place while the field-effect transistor is turned on by means of a transition of the word line WL from a low (LOW) to a higher potential (HIGH). This results in an increased channel current (charging current) compared with a conventional fixed well potential. This capacitive coupling is initially effected via the so-called junction capacitance of the pn junction of the diode doping region 4. Over and above that, however, this capacitive coupling, as has been described above, can be improved by means of the remaining STI oxide or the dielectric layer 6 at the sidewalls of the depression V for the purpose of realizing the additional capacitor C.

In inactive phases, the word line WL stabilizes the potential of the body or semiconductor substrate. In this case, an upper threshold for the well potential or the potential of the semiconductor substrate is prescribed by the word line low potential by means of the diode D. If the potential of the well or of the semiconductor substrate rises above the prescribed threshold due to various leakage currents (e.g. junction leakage) then electrons are injected via the pn junction or the diode doping region 4 and recombined with the excess holes in the body.

FIGS. 9A to 9F show simplified sectional views along a section III-III in FIG. 8 for illustrating method steps in the fabrication of a semiconductor structure in accordance with the second exemplary embodiment, identical reference symbols once again designating elements and layers identical or corresponding to those in FIGS. 1 to 8 and a repeated description being dispensed with below.

Figure 9A:
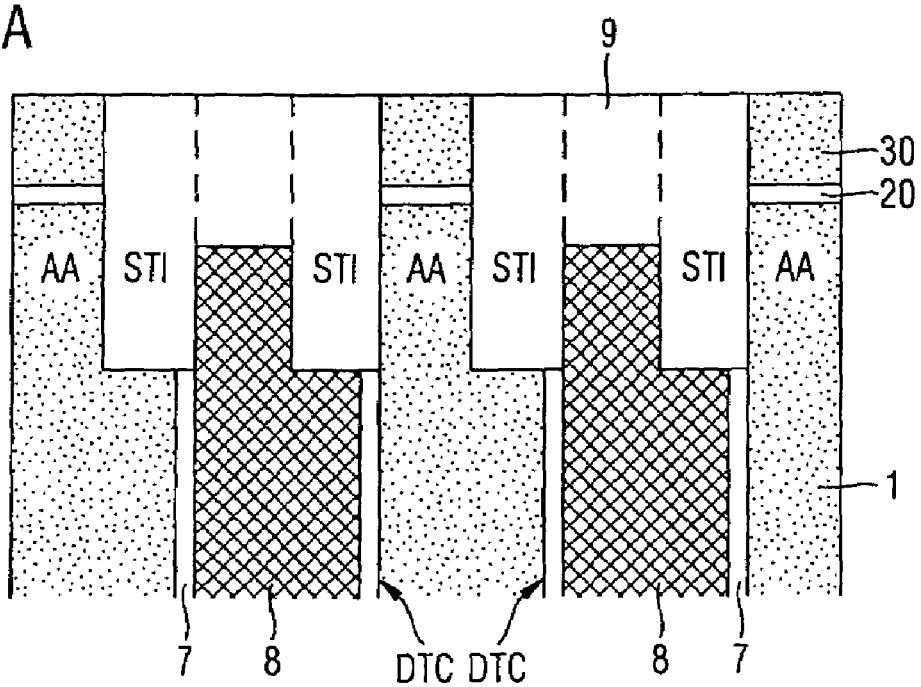
FIGS. 9A to 9F show simplified sectional views along a section III-III in accordance with FIG. 8 for the purpose of illustrating essential fabrication steps in a fabrication method in accordance with the second exemplary embodiment.

In accordance with FIG. 9A, first of all trench capacitors DTC with their illustrated trench capacitor connection layer regions 8 and insulation collar layers 7 are illustrated in a customary manner by way of example after a standard DRAM process in a semiconductor substrate 1. Depending on a standard process respectively used the trench capacitor connection layer 8 in this case preferably comprises highly doped polysilicon and the trench insulation layer 7 preferably comprises silicon oxide.

Using a mask layer comprising a PAD oxide layer 20 and a PAD nitride layer 30, trench isolations STI are furthermore formed for the purpose of designing active regions AA at the surface of the semiconductor substrate. The trench isolations STI are preferably formed by means of a conventional STI process for realizing shallow trench isolation, a silicon dioxide layer (TEOS) being deposited. For the passivation or for the insulation of the trench capacitors DTC essentially formed in the active regions AA, top insulating layers 9, which once again preferably comprise silicon dioxide, are additionally formed at these locations. The correspondingly prepared semiconductor substrate illustrated in FIG. 9A is obtained by means of such a standard process.

Figure 9B:
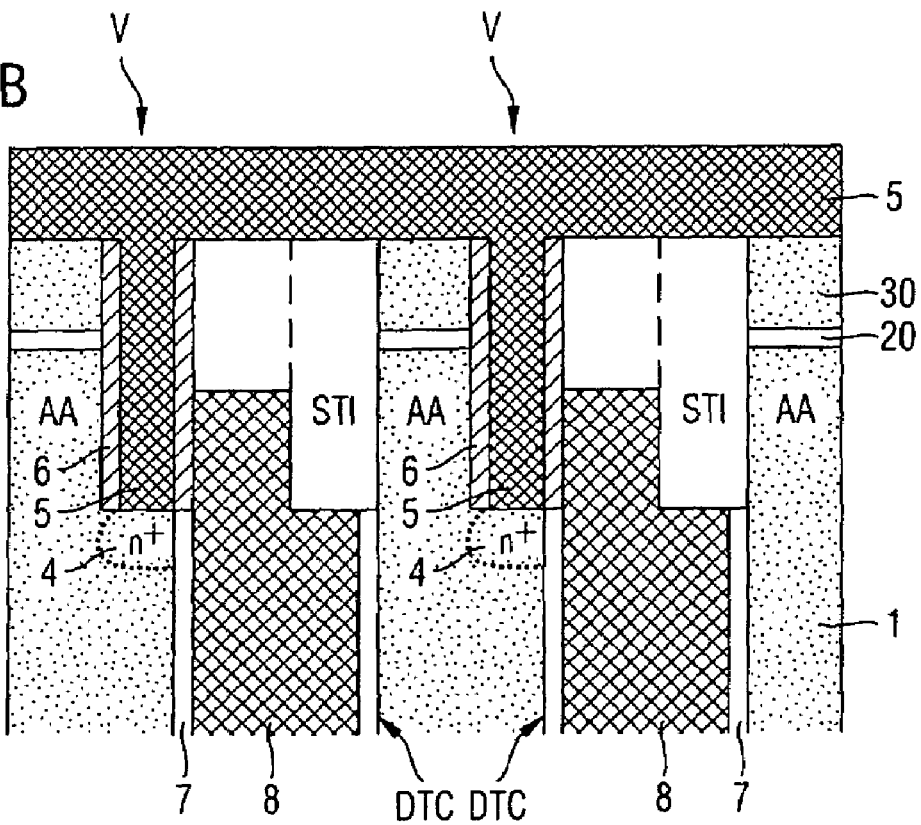

In accordance with FIG. 9B, in a subsequent step, the depressions V are then formed in predetermined regions of the trench isolation STI such that they penetrate completely through the trench isolation and extend right into the semiconductor substrate 1. The depressions V may be realized for example by using a conventional mask as is used in the fabrication of contact holes or vias, a corresponding anisotropic oxide etching method preferably being carried out.

Given a correspondingly high alignment accuracy for the depressions V, sufficiently thick insulating layers remaining from the STI oxide are obtained at the sidewalls of the depressions V. However, if less stringent requirements are made of the alignment accuracy for the depressions V, then in a subsequent process step it is optionally possible for a dielectric layer 6 to be formed at the sidewalls of the depression V, in which case, preferably by means of a conventional spacer method, a thin silicon dioxide layer is deposited conformally, i.e. with the same thickness, and is subsequently etched back anisotropically.

After the formation of the depression V or after the optional formation of the additional dielectric layer 6, it is possible, in accordance with a first embodiment, firstly to carry out a doping of the semiconductor substrate 1 in the region of the bottom of the depression V, a gas phase doping for example, but in particular an ion implantation being carried out. The diode doping regions of the first conduction type which are illustrated in FIG. 9B, and which are preferably highly doped, are produced in this way.

Afterward, an electrically conductive filling material is formed as diode connection layer 5 in the depression V in accordance with the first embodiment, in which case, by way of example, an electrically conductive material is deposited over the whole area and subsequently planarized as far as the surface of the depression V, e.g. by means of a CMP method (chemical mechanical polishing).

In accordance with a second preferred embodiment, however, no doping from the gas phase or ion implantation is carried out, rather directly after the formation of the depression V or after the formation of the electrically insulating sidewalls 6, a doped semiconductor material is formed as diode connection layer 5 at least in the depression V, preferably a highly doped polycrystalline semiconductor material such as e.g. polysilicon of the first conduction type being deposited over the whole area and subsequently planarized.

In this case, the diode doping regions 4 are formed automatically and without an additional process step by outdiffusion of dopants from the diode connection layer 5 during a thermal treatment which is carried out subsequently and which is usually used in later process steps. In this way, the diode doping regions can be fabricated in a particularly simple manner.

Figure 9C:
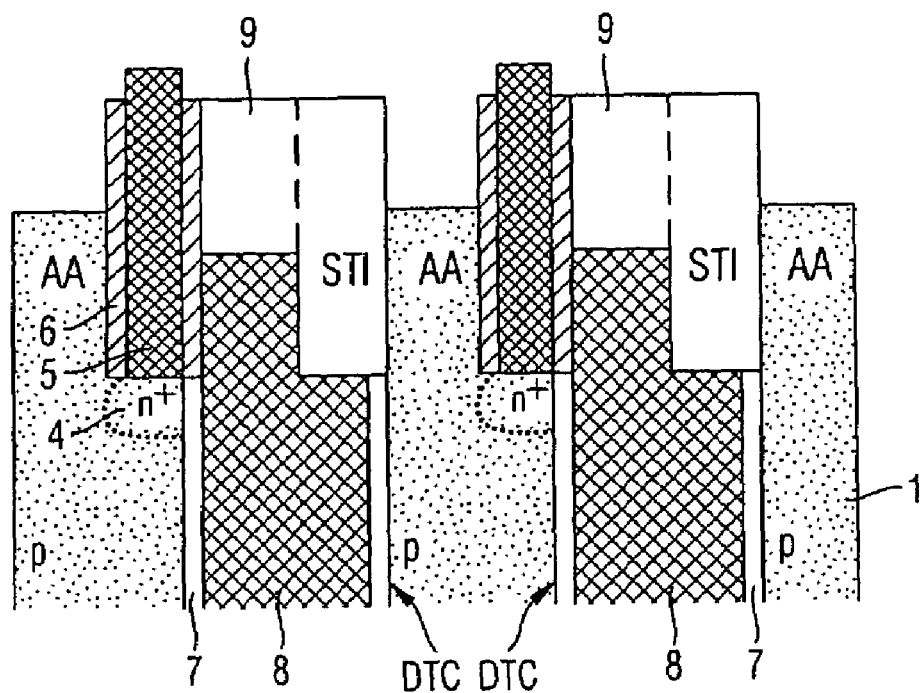

In accordance with FIG. 9C, after the planarization or removal of the diode connection layer 5 deposited at the surface, the mask layer is also removed, in which case, in the exemplary embodiment illustrated, the PAD nitride layer 30 is selectively removed by means of a nitride etching method and the PAD oxide layer 20 is selectively removed by means of an oxide etching method. A well implantation, for example, may optionally be carried out at this point in time, in which case first of all a sacrificial insulation layer (not illustrated) is formed over the whole area, then an ion implantation is carried out and, finally, the sacrificial insulation layer is removed again. This yields a well or a semiconductor substrate 1 of the conduction type p, opposite to the first conduction type n, in the active regions AA. In the case of simple structures, however, such well implantations may also be absent and an existing doping of the opposite conduction type p in the semiconductor substrate 1 suffices.

In accordance with FIG. 9D, the gate insulation layer 2 is subsequently formed at least at the surface of the active regions AA, a thermal oxidation preferably converting all of the uncovered semiconductor regions in order to realize a high-quality gate oxide. Accordingly, in accordance with FIG. 9D, not only the uncovered regions of the active regions AA, but also the uncovered regions of the diode connection layer 5 comprising polysilicon are covered with the insulating layer. Since this thermal oxidation already constitutes a thermal after-treatment for realizing the diode doping region 4, accordingly, at the latest at this point in time, the diode doping regions 4 are actually realized by means of outdiffusion in the semiconductor substrate 1 or semiconductor regions disturbed by ion implantation are annealed.

Figure 9D:
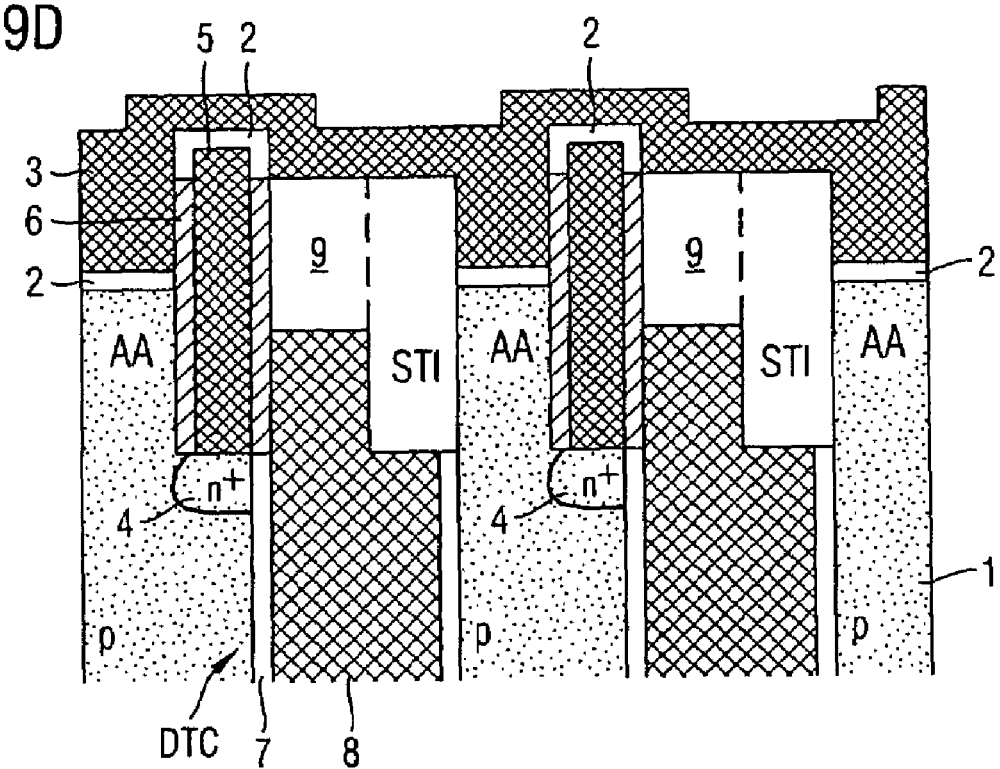

Afterward, in accordance with FIG. 9D, the control layer 3 is formed at least at the surface of the gate insulation layer 2, a whole-area deposition of an electrically conductive material, and in particular of highly-doped polysilicon, once again of the first conduction type, preferably being carried out.

Figure 9E:
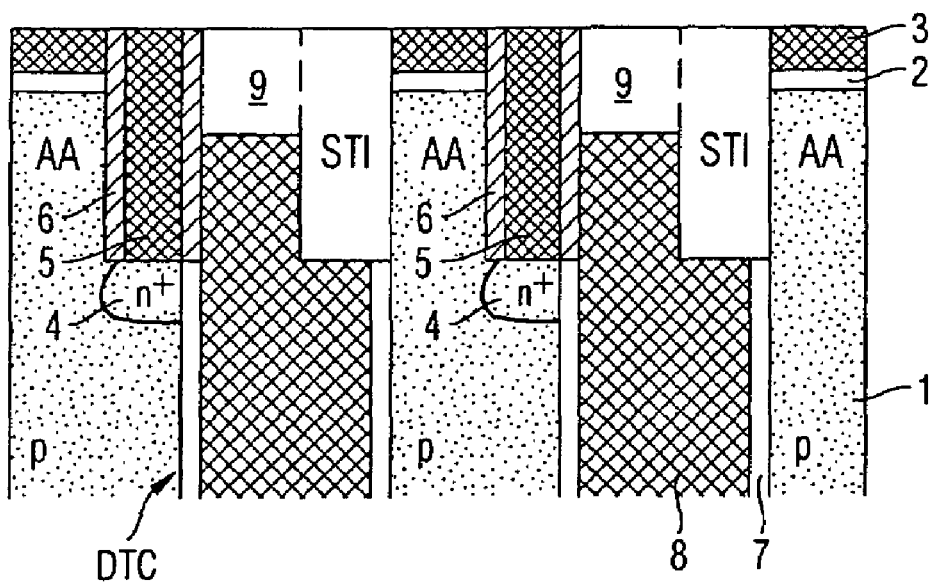

In accordance with FIG. 9E, a planarization step is then once again effected, stopping approximately 20 to 30 nanometers above the semiconductor substrate 1. Preferably, a CMP method is effected for planarizing the fabricated surface at least as far as the trench isolation STI, thereby uncovering both a surface of the control layer 3 and a surface of the diode connection layer 5.

Figure 9F:
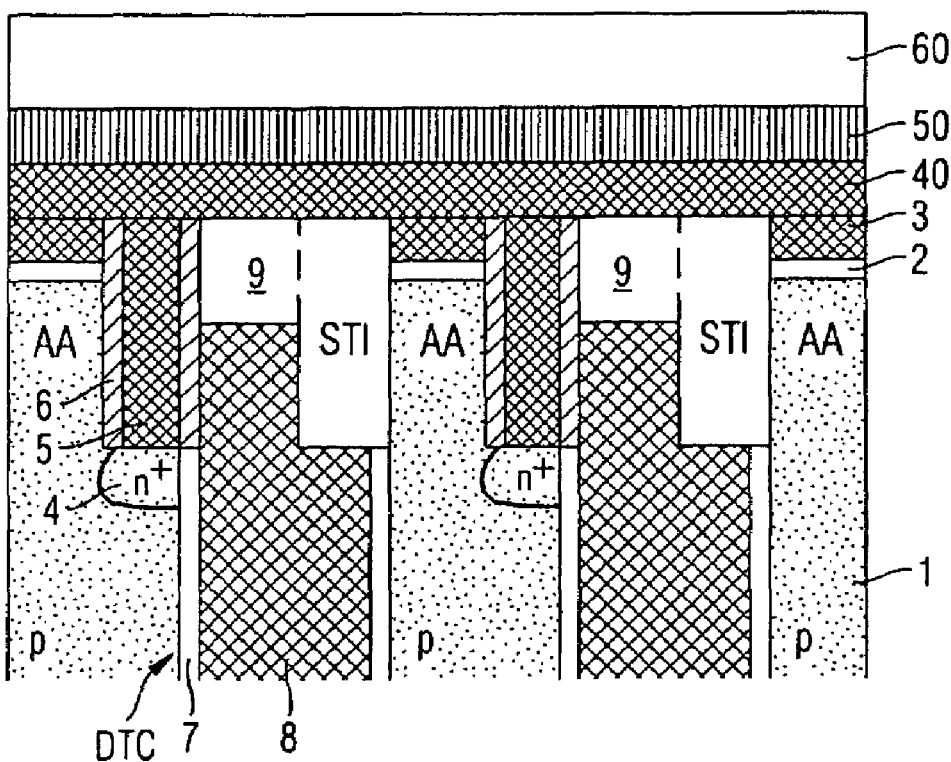

Finally, in accordance with FIG. 9F, an electrically conductive connecting layer for connecting the control layer 3 to the diode connection layer 5 is formed. Preferably, in this case, firstly a further highly doped semiconductor layer of the first conduction type is deposited over the whole area, an $n^+$-doped polysilicon 40 preferably being used. Afterward, in order to further improve the electrical conductivity of the connecting layer and in order to realize highly conductive connection regions for the first connecting layer 40, siliconizable material or a siliconizable metal layer may be deposited over the whole area. Finally, in this case, a conversion of the surface layer of the semiconductor material 40 is carried out using the siliconizable material 50 in order to form a highly conductive connecting layer, in which case, at the surfaces which are not in contact in the semiconductor material (silicon) no silicide is formed, rather the deposited material (metal) remains, for which reason the deposited layers can be selectively etched back very easily once again by means of a preferably wet-chemical etching method. Besides the use of cobalt, nickel or platinum, tungsten in particular is deposited in this case in order to form a tungsten suicide layer 50.

Afterward, silicon nitride, for example, is deposited over the whole area as a further mask or passivation layer 60. The further process steps for completing the DRAM semiconductor memory cell or the field-effect transistor structure correspond to the standard process steps, for which reason a detailed description is dispensed with below. What are then essentially effected, however, are the etching of the gate stacks or the word lines WL, the formation of the source/drain regions S/D and the formation of the bit lines BL with their associated contacts BLK to the respective source/drain regions.

The invention has been described above on the basis of a DRAM semiconductor memory cell. However, it is not restricted thereto and encompasses in the same way all further field-effect transistor structures and associated semiconductor memory cells and associated fabrication methods in which an impairment of electrical properties on account of a so-called body effect can be observed. In the same way, instead of the materials used, alternative semiconductors and insulation materials can also be used provided that they have the same properties.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

The invention claimed is:

1. A field-effect transistor structure comprising:
   a first and second source/drain region of a first conduction type, which are formed in a semiconductor substrate of a second conduction type, to define a channel region;
   a gate insulation layer formed at a surface of the channel region;
   a control layer formed at a surface of the gate insulation layer;
   a diode doping region of the first conduction type that realizes a diode in the semiconductor substrate;
   an electrically conductive diode connection layer that connects the diode doping region to the control layer; and
   a depression formed in the semiconductor substrate, the diode doping region formed at a bottom of the depression and the diode connection layer formed in the depression to dissipate excess charge carriers in the semiconductor substrate;
   a dielectric layer formed at walls of the depression between the diode connection layer and the semiconductor substrate to realize a capacitor connected to the control layer.

2. A field-effect transistor structure comprising:
   a first and second source/drain region of a first conduction type, which are formed in a semiconductor substrate of a second conduction type, to define a channel region;
   a gate insulation layer formed at a surface of the channel region;
   a control layer formed at a surface of the gate insulation layer;
   a diode doping region of the first conduction type that realizes a diode in the semiconductor substrate;
   an electrically conductive diode connection layer that connects the diode doping region to the control layer; and
   a depression formed in the semiconductor substrate, the diode doping region formed at a bottom of the depression and the diode connection layer formed in the depression to dissipate excess charge carriers in the semiconductor substrate;
   wherein the depression is formed directly beside the channel region.

3. The field-effect transistor structure as claimed in claim 2, wherein the depression is formed in a shallow trench isolation to define a channel width of the channel region.

4. A semiconductor memory cell having the field-effect transistor structure as claimed in claim 3, wherein:
   the first source/drain region is connected to a trench capacitor;
   the second source/drain region is connected to a bit line;
   the control layer constitutes a part of a word line running substantially perpendicular to the bit line;
   the diode doping region is formed below the word line in the semiconductor substrate; and
   the trench isolation is formed in strip-type fashion in the semiconductor substrate to form strip-type active regions, the trench capacitor substantially lying in the active region.

5. The semiconductor memory cell as claimed in claim 4, wherein the trench capacitor has, at a surface, a width which is greater than a width of the active region such that, to uncover a trench isolation adjoining the active region, the trench capacitor is displaced into an adjoining trench isolation.

6. The semiconductor memory cell as claimed in claim 5, wherein a surface cross section of the trench capacitor has an oval form and a displacement of at most 0.5 F, where F represents a minimum feature size that can be fabricated lithographically.

7. A field-effect transistor structure comprising:
   a first and second source/drain region of a first conduction type, which are formed in a semiconductor substrate of a second conduction type, to define a channel region;
   a gate insulation layer formed at a surface of the channel region;
   a control layer formed at a surface of the gate insulation layer;

a diode doping region of the first conduction type that realizes a diode in the semiconductor substrate;

an electrically conductive diode connection layer that connects the diode doping region to the control layer; and a depression formed in the semiconductor substrate, the diode doping region formed at a bottom of the depression and the diode connection layer formed in the depression to dissipate excess charge carriers in the semiconductor substrate;

wherein the diode connection layer has highly doped semiconductor material of the first conduction type.

8. A semiconductor memory cell having a field-effect transistor structure comprising:

a first and second source/drain region of a first conduction type, which are formed in a semiconductor substrate of a second conduction type, to define a channel region;

a gate insulation layer formed at a surface of the channel region;

a control layer formed at a surface of the gate insulation layer;

a diode doping region of the first conduction type that realizes a diode in the semiconductor substrate;

an electrically conductive diode connection layer that connects the diode doping region to the control layer; and a depression formed in the semiconductor substrate, the diode doping region formed at a bottom of the depression and the diode connection layer formed in the depression to dissipate excess charge carriers in the semiconductor substrate;

wherein:

the first source/drain region is connected to a trench capacitor;

the second source/drain region is connected to a bit line;

the control layer constitutes a part of a word line running substantially perpendicular to the bit line; and the diode doping region is formed below the word line in the semiconductor substrate.

9. The semiconductor memory cell as claimed in claim 8, further comprising a buried connection plate that connects to a counterelectrode of the trench capacitor formed in the semiconductor substrate, the diode doping region being situated between the buried connection plate and a surface of the semiconductor substrate.

10. The semiconductor memory cell as claimed in claim 8, wherein the semiconductor memory cell constitutes a DRAM memory cell.

11. A field-effect transistor structure comprising:

a first and second source/drain region of a first conduction type, which are formed in a semiconductor substrate of a second conduction type, to define a channel region;

a gate insulation layer formed at a surface of the channel region;

a control layer formed at a surface of the gate insulation layer;

a diode doping region of the first conduction type that realizes a diode in the semiconductor substrate;

an electrically conductive diode connection layer in the substrate that connects the diode doping region to the control layer; and a collar insulation layer adjacent to the diode doping region.

12. The field-effect transistor structure as claimed in claim 11, further comprising dielectric layers formed at opposing sides of the diode connection layer.

13. The field-effect transistor structure as claimed in claim 12, wherein one of the dielectric layers is formed directly beside the channel region.

14. The field-effect transistor structure as claimed in claim 12, further comprising a trench capacitor connection layer adjacent to one of the dielectric layers and the collar insulation layer.

* * * * *